(12) United States Patent
Hacker (10) Patent No.: US 10,446,431 B2
(45) Date of Patent: Oct. 15, 2019

(54) TEMPORARY CARRIER DEBOND INITIATION, AND ASSOCIATED SYSTEMS AND METHODS

(71) Applicant: Micron Technology, Inc., Boise, ID (US)

(72) Inventor: Jonathan S. Hacker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 15/855,622

(22) Filed: Dec. 27, 2017

(65) Prior Publication Data

US 2019/0198377 A1 Jun. 27, 2019

(51) Int. Cl.
| | | |
|---|---|---|
| *B32B 43/00* | (2006.01) | |
| *H01L 21/00* | (2006.01) | |
| *H01L 21/683* | (2006.01) | |
| *H01L 21/67* | (2006.01) | |
| *H01L 23/00* | (2006.01) | |

(52) U.S. Cl.
CPC ........ *H01L 21/6836* (2013.01); *B32B 43/006* (2013.01); *H01L 21/67023* (2013.01); *H01L 24/98* (2013.01); *B32B 2457/14* (2013.01); H01L 2221/68318 (2013.01); H01L 2221/68386 (2013.01); Y10S 156/93 (2013.01); Y10S 156/941 (2013.01); Y10T 156/1111 (2015.01); Y10T 156/1126 (2015.01); Y10T 156/1137 (2015.01); Y10T 156/1168 (2015.01); Y10T 156/1933 (2015.01); Y10T 156/1939 (2015.01); Y10T 156/1978 (2015.01)

(58) Field of Classification Search
CPC ......... Y10T 156/1126; Y10T 156/1137; Y10T 156/1168; Y10T 156/1933; Y10T 156/1939; Y10T 156/1111; Y10T 156/1978; H01L 2221/68318; H01L 2221/68386; Y10S 156/93; Y10S 156/941
See application file for complete search history.

(56) References Cited

U.S. PATENT DOCUMENTS

| | | | | |
|---|---|---|---|---|
| 8,852,391 | B2 * | 10/2014 | McCutcheon | ........ H01L 21/187 156/714 |
| 9,111,981 | B2 * | 8/2015 | Flaim et al. | ........ H01L 21/6835 |
| 2001/0001975 | A1 * | 5/2001 | Sakaguchi | ........ H01L 21/67092 156/239 |
| 2002/0029849 | A1 * | 3/2002 | Ohmi | ................ H01L 21/67092 156/708 |

(Continued)

*Primary Examiner* — Mark A Osele
(74) *Attorney, Agent, or Firm* — Perkins Coie LLP (57) ABSTRACT

Systems and methods for debonding a carrier from a semiconductor device are disclosed herein. In one embodiment, a system for debonding a carrier from a semiconductor device includes a support member positioned to carry the semiconductor device and a fluid delivery device having an exit positioned to direct a fluid toward an adhesive layer between the carrier and the semiconductor device. The fluid directed from the fluid delivery device initiates debonding of the carrier from the semiconductor device by weakening or loosening at least a portion of the adhesive. The system further includes a liftoff device configured to releasably engage the carrier and apply a debonding force to the carrier to complete debonding of the carrier from the semiconductor device.

19 Claims, 4 Drawing Sheets

(56) References Cited

U.S. PATENT DOCUMENTS

| | | | | |
|---|---|---|---|---|
| 2003/0010445 A1* | 1/2003 | Yanagita | ............ | H01L 21/67092 |
| | | | | 156/708 |
| 2012/0000613 A1* | 1/2012 | Thallner | ............ | H01L 21/67092 |
| | | | | 156/703 |
| 2014/0318697 A1* | 10/2014 | Tan | ........................ | H01L 21/673 |
| | | | | 156/247 |
| 2015/0325465 A1* | 11/2015 | Iwata | .................. | B32B 38/1858 |
| | | | | 156/703 |
| 2017/0106644 A1* | 4/2017 | Zhao | ..................... | B32B 43/006 |

\* cited by examiner

TEMPORARY CARRIER DEBOND INITIATION, AND ASSOCIATED SYSTEMS AND METHODS

TECHNICAL FIELD

The present technology generally relates to systems and methods for initiating the debonding of a temporary carrier from a semiconductor device.

BACKGROUND

Packaged semiconductor dies, including memory chips, microprocessor chips, and imager chips, typically include a semiconductor die mounted on a substrate and (optionally) encased in a protective covering (e.g., a molded material, encapsulant, plastic, etc.). The semiconductor die includes functional features, such as memory cells, processor circuits, and/or imager devices, as well as bond pads electrically connected to these functional features. The bond pads can be electrically connected to outside terminals to allow the semiconductor die to be connected to other devices (e.g., higher level circuitry).

During a conventional manufacturing process, many semiconductor dies are manufactured together on a semiconductor wafer, which is then singulated or diced to form individual dies. Frequently, the semiconductor wafer is too thin for processing steps to be carried out on the semiconductor wafer alone, so a carrier is temporarily bonded to the semiconductor wafer. The carrier supports the semiconductor wafer and provides a means for handling the semiconductor wafer during processing. After processing is finished on the semiconductor wafer, the carrier is debonded by, for example, inserting a blade between the carrier and the semiconductor wafer to initiate debonding, and then mechanically separating the carrier from the semiconductor wafer. One drawback with the foregoing technique is that the blade used to initiate debonding of the carrier can damage the carrier and/or the semiconductor device if it is not precisely positioned to contact only the interface between the carrier and the semiconductor device. Another drawback is that the blade must be periodically cleaned and/or replaced.

DETAILED DESCRIPTION

Specific details of several embodiments of systems and methods for debonding a temporary carrier from a semiconductor device are described below. In several of the embodiments described below, a system for debonding a carrier from a semiconductor device includes a fluid delivery device configured to direct a stream of fluid toward an interface between the temporary carrier and the semiconductor device. In some embodiments, the fluid delivery device directs the fluid stream toward one or more layers of adhesive that temporarily bond the carrier to the semiconductor device. The fluid can initiate debonding of the carrier from the semiconductor device by, for example, loosening or weakening a portion of the adhesive layer. In some embodiments, the system further includes a liftoff device configured to (i) releasably engage the carrier and (ii) to complete the debonding process by mechanically separating the carrier from the semiconductor device after the fluid delivery device has initiated debonding. In several embodiments, the fluid stream delivered by the fluid delivery device can initiate debonding without damaging the semiconductor device or carrier. Moreover, because only the fluid stream contacts the interface between the carrier and semiconductor die, the fluid delivery device initiates debonding without being subjected to contamination from, for example, contact with the adhesive layers between the semiconductor device and carrier. Accordingly, systems configured in accordance with the present technology are expected to lower operating costs and increase system uptime compared to conventional systems, since the fluid delivery device does not need to be cleaned and/or replaced on a frequent basis.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
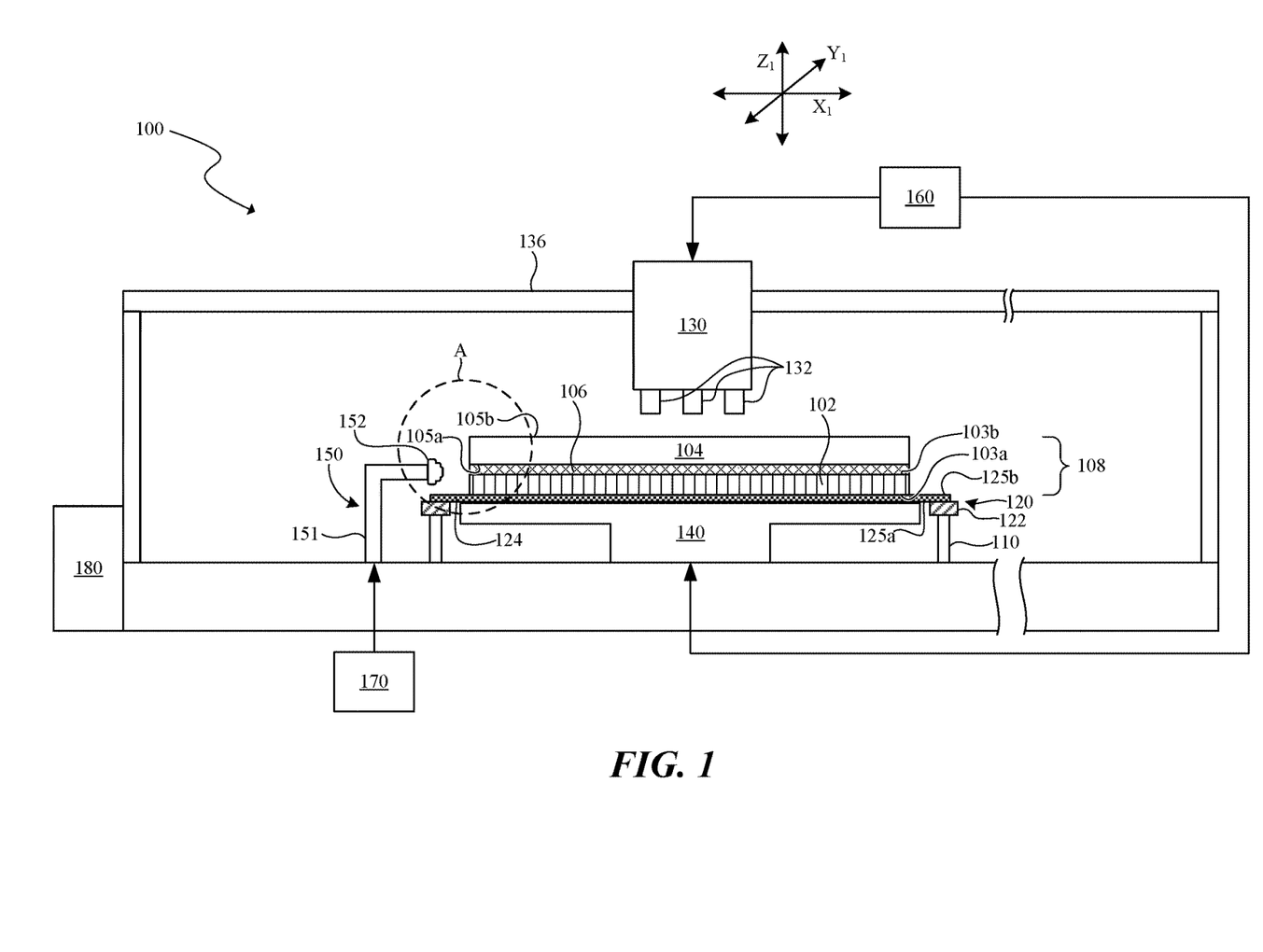
FIG. 1 is a partially schematic side view of a system for debonding a carrier from a semiconductor device in accordance with an embodiment of the present technology.

FIG. 1 is a partially schematic side view of a system 100 for debonding a carrier 104 from a semiconductor device 102 in accordance with embodiments of the present technology. The system 100 includes a support member 110 that carries a support substrate 120. The support substrate 120 itself carries a semiconductor processing stack 108 ("stack 108") comprising the semiconductor device 102, the carrier 104, and a bonding adhesive 106 disposed therebetween. A liftoff device 130 is positionable above the carrier 104 for releasably engaging the carrier 104 and debonding (e.g., separating) the carrier 104 from the semiconductor device 102. In certain embodiments, a restraint device 140 is positioned below the support substrate 120 for securing or restraining the support substrate 120 and the semiconductor device 102 during the debonding process. The system 100 further includes a fluid delivery device 150 configured to direct a fluid toward the stack 108 (e.g., toward an interface between the semiconductor device 102 and the carrier 104) to initiate debonding by loosening or weakening the adhesive forces between the semiconductor device 102 and the carrier 104 prior to or simultaneously with the liftoff device 130 removing the carrier 104. This is expected to reduce damage to the semiconductor device 102 and the carrier 104 during the debonding process as compared to, for example, conventional devices (e.g., blades or other mechanical devices) for initiating debonding of a temporary carrier from a semiconductor device.

In a particular embodiment, the support substrate 120 comprises a dicing frame 122 and a sheet of dicing tape 124 having a lower surface 125a and an upper surface 125b. As illustrated in FIG. 1, the dicing frame 122 carries the dicing tape 124 and can have an annular shape such that all or a portion of the semiconductor device 102 is over only the dicing tape 124. Therefore, the lower surface 125a of the dicing tape 124 can be exposed below the semiconductor device 102. The semiconductor device 102 includes a lower surface 103a releasably attached to the upper surface 125b of the dicing tape 124 and an upper surface 103b opposite the lower surface 103a and temporarily bonded to the carrier 104 via the bonding adhesive 106. The dicing tape 124 can include a UV-cured, cross-linked material that engages with the semiconductor device 102 via electrostatic forces, mechanical forces (e.g., by conforming to topographical features on the lower surface 103a of the semiconductor device 102), and/or other forces. In some embodiments, the semiconductor device 102 is a semiconductor wafer or panel that can be singulated or has been singulated into a plurality of individual semiconductor dies. While the semiconductor device 102 is generally illustrated herein as having a circular planform shape, in other embodiments, the semiconductor device 102 can have any other suitable shape (e.g., rectilinear, oval, polygonal, etc.).

The carrier 104 includes a lower surface 105a temporarily bonded to the semiconductor device 102 via the bonding adhesive 106, and an upper surface 105b opposite the lower surface 105a. The carrier 104 provides mechanical support for processing stages carried out on the semiconductor device 102 (e.g. thinning, metallization formation, via-formation, etc.) and can be formed from, for example, silicon, silicon-on-insulator, compound semiconductor (e.g., Gallium Nitride), glass, or other suitable materials. In some embodiments, the carrier 104 can be reused after it is debonded from the semiconductor device 102. As described in further detail with reference to FIG. 2A, the bonding adhesive 106 can comprise one or layers of adhesive material that temporarily bond the carrier 104 to the semiconductor device 102.

The liftoff device 130 can include one or more lifting heads 132 configured to releasably engage the upper surface 105b of the carrier 104. In some embodiments, the lifting heads 132 can be coupled to a vacuum source 160, which allows the lifting heads 132 to releasably engage with the semiconductor device 102 via a suction or vacuum force. In order to debond the carrier 104 from the semiconductor device 102, the liftoff device 130 is configured to apply a debonding force to the carrier 104. For example, the liftoff device 130 can be coupled to a guide 136 or other suitable device that allows the liftoff device to move along one or more axes (e.g., along one or more of the axes indicated by reference numerals $X_1$, $Y_1$, and $Z_1$). In some embodiments, the liftoff device 130 can releasably engage the carrier 104 and be moved upwards away from the semiconductor device 102 (e.g., along the $Z_1$-axis) to debond the carrier 104 from the semiconductor device 102. In certain embodiments, the liftoff device 130 is also moved laterally (e.g., along the axes $Y_1$ and/or $X_1$) to debond the carrier 104 from the semiconductor device 102.

The system 100 can further include components for selectively holding the support substrate 120 and/or the semiconductor device 102 in position (e.g., stationary) during the debonding process. For example, in some embodiments, the restraint device 140 can be coupled to the vacuum source 160 such that the restraint device 140 can releasably engage the lower surface 125a of the dicing tape 124 (e.g., below the semiconductor device 102) via a vacuum force. Accordingly, in certain embodiments, the restraint device 140 can apply a downward force (e.g., along the $Z_1$-axis) to the dicing tape 124 while the liftoff device 130 engages the carrier 104 and lifts the carrier 104 upward, away from the semiconductor device 102. The restraint device 140 therefore facilitates debonding of the carrier 104 from the semiconductor device 102 by maintaining the semiconductor device 102 in a stationary or substantially stationary position relative to the liftoff device 130 during debonding. In the embodiment illustrated in FIG. 1, the restraint device 140 has a dimension (e.g., width or diameter along the $X_1$-axis) that is greater than a corresponding dimension of the semiconductor device 102. However, in other embodiments, the restraint device 140 can have any other suitable shape and/or configuration for releasably securing the semiconductor device 102. For example, the restraint device 140 could have a dimension that is smaller than the corresponding dimension of the semiconductor device 102, and/or could have a plurality of heads or ports for applying a vacuum or other force to the lower surface 125a of the dicing tape 124.

In some embodiments, the vacuum source 160 can be further coupled to the support member 110 to hold the support substrate 120 (e.g., the dicing frame 122) in position relative to the support member 110. In other embodiments, the system 100 can include multiple vacuum sources, for example, one to hold the dicing frame 122 in position, another to releasably engage the lower surface 125a of the dicing tape 124, and/or another to hold the carrier 104 in contact with the lifting heads 132. In other embodiments, the support substrate 120 can be fastened or fixed to the support member 110 by other mechanical mechanisms. For example, the dicing frame 122 can be secured to the support member 110 via clips, fasteners, adhesives, etc.

The system 100 can further include a fluid source 170 configured to supply a fluid to the fluid delivery device 150. In the embodiment illustrated in FIG. 1, the fluid delivery device 150 includes an arm 151 fluidly coupled to a nozzle 152. As described in further detail below with reference to FIGS. 2A-4, the nozzle 152 is configured to direct the fluid from the fluid source 170 toward the stack 108 to initiate debonding of the carrier 104 from the semiconductor device 102.

In some embodiments, in order to facilitate initiation of the debonding of the carrier 104 from the semiconductor device 102, the system 100 is configured to provide for relative movement of the fluid delivery device 150 and the support member 110. That is, the position of the stack 108 relative to the nozzle 152 of the fluid delivery device 150 is variable so that fluid can be directed against the stack 108 at more than one location (e.g., against more than one exposed portion of the bonding adhesive 106). For example, in certain embodiments, the arm 154 of the fluid delivery device 150 is movable along one or more axes (e.g., along the three axes $X_1$, $Y_1$, and $Z_1$) such that the nozzle 152 can be positioned (e.g., aligned) differently with respect to the stack 108. In certain embodiments, the fluid delivery device 150 is configured for rotational (e.g., circumferential) movement relative to the stack 108 along a track or other suitable device. In some embodiments, in addition to or in lieu of the fluid delivery device 150 moving, the support member 110 can be actuated to translate relative to one or more axes (e.g., along the three axes $X_1$, $Y_1$, and $Z_1$) and/or to rotate such that the stack 108 moves relative to the fluid delivery device 150.

In some embodiments, the system 100 includes a controller 180 programmed with instructions for directing the operations and motions carried out by the support member 110, the liftoff device 130, the restraint device 140, the fluid delivery device 150, and/or other components of the system 100. Accordingly, the controller 180 can include a processor, memory, input/output devices, and a computer-readable medium containing instructions for performing some or all of the tasks described herein.

Figure 2A:
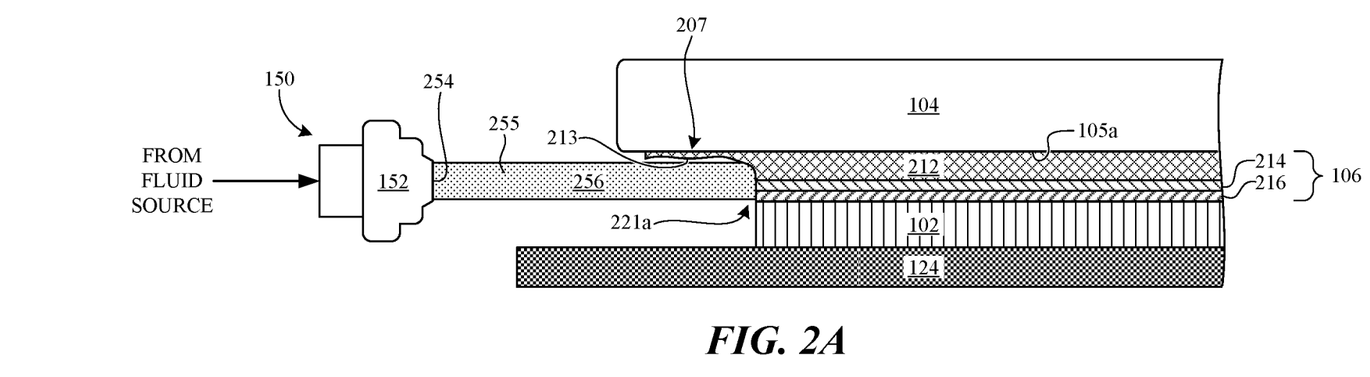
FIG. 2A is a partially schematic side cross-sectional view of a portion of the system shown in FIG. 1 including a fluid delivery device configured in accordance with an embodiment of the present technology.
Figure 2B:
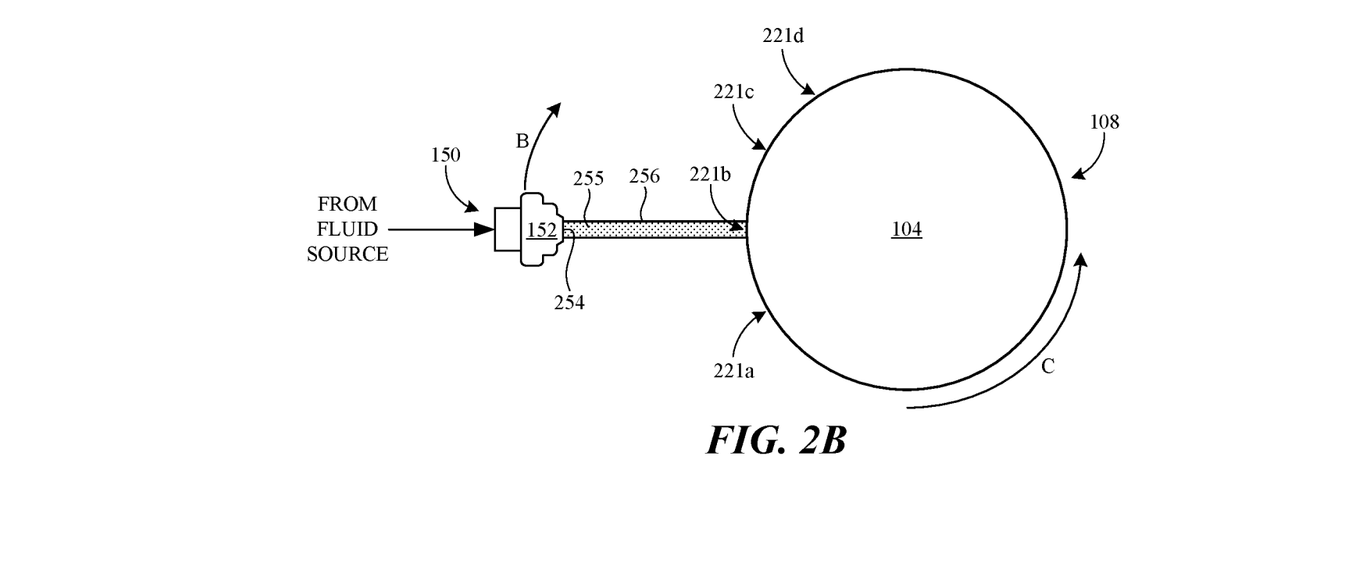
FIG. 2B is a partially schematic, top plan view a portion of the system shown in FIG. 1 including a fluid delivery device configured in accordance with an embodiment of the present technology.
Figure 2C:
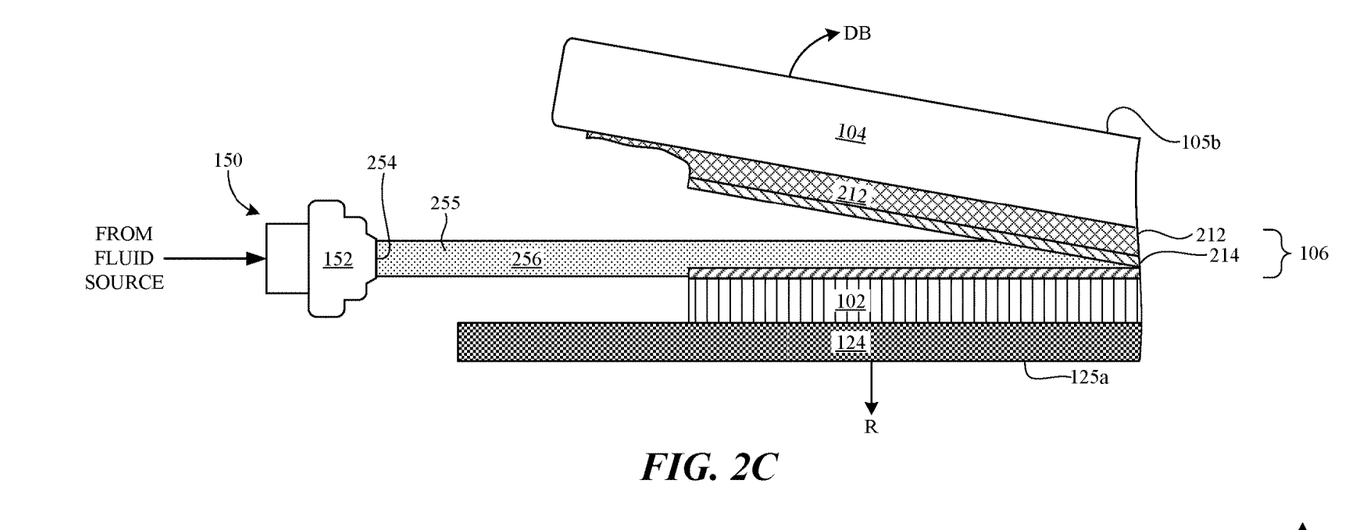
FIG. 2C is a partially schematic side cross-sectional view of a portion of the system shown in FIG. 1 including a fluid delivery device configured in accordance with an embodiment of the present technology.

FIGS. 2A-2C are enlarged, partially schematic views of a portion of the system 100 shown in FIG. 1 at different stages in a debonding operation for removing a temporary carrier from a semiconductor device. In particular, FIG. 2A is a side cross-sectional view illustrating a portion of the stack 108, the dicing tape 124, and the fluid delivery device 150 in a region A illustrated in FIG. 1. In the embodiment illustrated in FIG. 2A, the bonding adhesive 106 includes multiple layers such as, for example, a support layer 212, a release layer 214, and a protection layer 216 (collectively "layers 212-216"). The layers 212-216 can be disposable adhesive films (e.g. die-attach films, laminate films of epoxy-based material, etc.), epoxies, tapes, pastes, or other suitable materials. As shown, the support layer 212 can have a greater thickness than the release layer 214 and/or the protection layer 216, and each of the layers 212-216 can comprise a different material. In other embodiments, the layers 212-216 can be the same material and/or have substantially the same thickness.

In certain embodiments, the support layer 212 can be deposited on the carrier 104 via spin coating or another suitable process before the carrier 103 is bonded to the semiconductor device 102. In some embodiments, the release layer 214 can be selected based on characteristics of its reaction with a fluid delivered from the fluid delivery device 150. For example, the material or materials used to form the release layer 214 can be selected based on the degree to which those materials dissolve or erode when exposed to the fluid delivered from the fluid delivery device 150. In some embodiments, the protection layer 216 is formed on the upper surface 105b of the semiconductor device 102 to protect the semiconductor device 102 from possible damage or contamination during the bonding process and/or during processing of the semiconductor device 102. In certain embodiments, the lowest bond force in the system 100 is between the release layer 214 and the protection layer 216.

As further illustrated in the embodiment of FIG. 2A, the carrier 104 can include an edge exclusion region 207 that is not positioned over (e.g., above) the semiconductor device 102. The edge exclusion region 207 can result from processing steps that remove portions of the semiconductor device 102 at the edge exclusion region 207, or from using a carrier 104 with a greater dimension (e.g., width, diameter, etc.) than a corresponding dimension of the semiconductor device 102 to, for example, facilitate processing carried out at or near the edge of the semiconductor device 102. In some embodiments, at least a portion of the bonding adhesive 106—for example, a portion 213 of the support layer 212—can extend onto the lower surface 105a of the carrier 104 at the edge exclusion region 207. As illustrated in the embodiment of FIG. 2A, the portion 213 of the support layer 212 can have a varying thickness as a result of processing steps carried out on the semiconductor device 102.

The fluid delivery device 150 is configured to direct a fluid 255 from the fluid source (FIG. 1) toward the interface between the carrier 104 and the semiconductor device 102. More particularly, the nozzle 152 of the fluid delivery device 150 includes a nozzle exit 254 aligned with a first portion 221a (e.g., an edge portion) of the stack 108 and shaped to direct the fluid 255 in a stream 256 toward the exposed bonding adhesive 106 at the first portion 221a of the stack 108. The stream 256 can contact the bonding adhesive 106 to weaken or loosen the attachment forces (e.g., weaken a bonding force, adhesive force, etc.) between the layers 212-216 at and/or proximate to the first portion 221a of the stack 108. In the embodiment illustrated in FIG. 2A, the fluid delivery device 150 is configured such that the stream 256 is directed at and contacts only the bonding adhesive 106. In other embodiments (e.g., the embodiment illustrated in FIG. 3), the stream 256 can additionally impact the semiconductor device 102, the carrier 104, and/or the dicing tape 124.

In some embodiments, the lateral (e.g., horizontal) positioning of the nozzle 152 and nozzle exit 254 relative to the stack 108 can be varied. For example, in certain embodiments, the nozzle 152 can be positioned closer to the stack 108 to provide a more focused stream 256 of the fluid 255 and/or such that the stream 256 of the fluid 255 imparts a greater force against the bonding adhesive 106. Similarly, in some embodiments, the pressure of the fluid 255 supplied by the fluid source 170 can be varied such that the stream 256 has a greater or smaller velocity when leaving the nozzle exit 254, and therefore imparts a greater or smaller force against the bonding adhesive 106. For example, the fluid can have a pressure of about 1-75 PSI when leaving the nozzle exit 254. Moreover, while only a single nozzle 152 having a corresponding nozzle exit 254 is illustrated in FIG. 2A, the fluid delivery device 150 can have any number of nozzles and/or exits for directing the fluid 255 toward the interface between the carrier 104 and the semiconductor device 102 in, for example, multiple streams.

The fluid 255 can include one or more of a variety of suitable constituents, and can be in a liquid state or a gaseous state. For example, the fluid 255 can include a liquid such as deionized water and/or a gas such as nitrogen (e.g., an inert gas). In some embodiments, the fluid 255 comprises only an inert gas. In certain embodiments, the fluid 255 includes a solvent configured to dissolve (e.g., erode) all or a portion of the bonding adhesive 106. For example, the fluid 255 can include a solvent selected to dissolve the release layer 214 to more readily loosen or break the electrostatic, mechanical, and/or other bonds between the release layer 214 and the support layer 212 and/or protection layer 216. An operator of the system 100 and/or the controller 180 (FIG. 1) can control the composition of the fluid 255, depending on the particular application. For example, in some applications, using a fluid in a gaseous or substantially gaseous form may produce better results than a fluid having a liquid or substantially liquid form. Moreover, in some embodiments, the fluid 255 can be collected and subsequently returned to the fluid source 170 for reuse. In other embodiments, the fluid 255 is wholly or partially discarded after being directed from the nozzle 152. For example, the fluid 255 may be discarded because it is contaminated by the bonding adhesive 106 that has dissolved or broken away as a result of the operation of the fluid delivery device 150.

FIG. 2B is a top-plan view of the fluid delivery device 150 and the stack 108 after the fluid delivery device 150 and the stack 108 have been moved relative to each other to align the nozzle exit 254 of the nozzle 152 with a second portion 221b (e.g., edge portion) of the stack 108 that is different than the first portion 221a. For example, as described above, the fluid delivery device 150 can be configured to move circumferentially (e.g., clockwise in the direction of arrow B) relative to the stack 108, and/or the support substrate 120—and the stack 108 carried thereon—can be configured to move relative to the fluid delivery device 150 (e.g., rotate counterclockwise in the direction of arrow C). Accordingly, the stream 256 can impact the bonding adhesive 106 (FIG. 2A) at the second portion 221b of the stack 108 to loosen the bonding adhesive 106 at and/or proximate to the second portion 221b.

In some embodiments, the fluid delivery device 150 is configured to continuously direct the stream 256 toward the bonding adhesive 106 while the fluid delivery device 150 and stack 108 are moved relative to each other. In such embodiments, the fluid delivery device 150 can loosen the bonding adhesive 106 along a perimeter of the stack 108 between the first portion 221a and the second portion 221b. In some embodiments, the fluid delivery device 150 can be configured to loosen the bonding adhesive 106 around an entire perimeter of the stack 108. In other embodiments, the fluid delivery device 150 is configured only to direct the stream 256 toward the bonding adhesive 106 once the nozzle exit 254 of the nozzle 152 is aligned with the second portion 221b of the stack 108. While a continuous stream may provide greater loosening of the bonding adhesive 106, directing the stream 256 at discrete portions of the bonding adhesive 106 may provide sufficient weakening of the bonding adhesive 106 while also requiring the use of less fluid 255. As further shown in FIG. 2B, the nozzle exit 254 of the nozzle 152 can be subsequently aligned with a third portion 221c of the stack 108, a fourth portion 221d of the stack 108, and/or other portions of the stack 108 to provide for further weakening of the bonding forces between the carrier 104 and the semiconductor device 102. Nevertheless, in some embodiments, the fluid delivery device 150 is configured to direct the stream 256 toward only a single portion of the stack 108 (e.g., the first portion 221a).

Referring again to FIG. 2A, loosening one or more portions of the bonding adhesive 106 using the fluid delivery device 150 initiates debonding of the carrier 104 from the semiconductor device 102 by reducing the force needed to separate the carrier 104 from the semiconductor device 102. For example, the fluid delivery device 150 can cause a crack or other separation to form in the bonding adhesive 106. In some embodiments, a crack can form where the lowest bond force exists in the system—for example, between the release layer 214 and the protection layer 216. In embodiments where the fluid 255 includes a solvent, the fluid delivery device 150 can cause the crack to form where the fluid 255 contacts and dissolves the bonding adhesive 106 (e.g., at the release layer 214). In certain embodiments, the fluid delivery device 150 can initiate a debonding wave that propagates through all or a substantial portion of the bonding adhesive 106.

FIG. 2C is a side cross-sectional view of the system 100 shown in FIG. 2A after debonding (e.g., separation) of the carrier 104 from the semiconductor device 102 has begun. In the embodiment illustrated in FIG. 2C, a debonding force DB is applied to the upper surface 105b of the carrier 104 to separate the carrier 104 from the semiconductor device 102. At the same time, a restraint force R is applied to the lower surface 125a of the dicing tape 124. For example, as described with reference to FIG. 1, the liftoff device 130 can apply the debonding force DB to the carrier 104 while the restraint device 140 can apply the restraint force R to the dicing tape 124.

In the embodiment illustrated in FIG. 2C, the fluid delivery device 150 directs the stream 256 toward the bonding adhesive 106 while the debonding force DB is applied to the carrier 104 and the restraint force R is applied to the dicing tape 124. These forces can, for example, further act on the bonding adhesive 106 to help propagate a crack and/or debonding wave initiated by the fluid delivery device 150. In other embodiments, the debonding force DB and/or restraint force R can be applied only after the fluid delivery device 150 has finished loosening the bonding adhesive 106 (e.g., after directing the stream 256 toward each of the portions 221a-221d of the stack 108). Moreover, in some embodiments, the direction and/or magnitude of the debonding force DB can be selected based on the operation of the fluid delivery device 150. For example, the liftoff device 130 can be configured to apply a debonding force DB that has a component (e.g., a horizontal component) acting in a direction generally opposite to the direction of flow of the stream 256 from the nozzle exit 254. In certain embodiments, the direction and/or magnitude of the debonding force DB can be changed as the relative position of the carrier 104 and nozzle exit 254 changes.

In each of the embodiments described above, debonding of the carrier 104 from the semiconductor device 102 is initiated using a fluid stream from the fluid delivery device 150. In contrast to conventional methods that rely on a blade or other mechanical device for laterally initiating debonding of a temporary carrier, use of the fluid delivery device 150 is expected to reduce the likelihood of damaging the semiconductor device 102 and/or the carrier 104 during the debonding process. For example, the fluid delivery device 150 can be configured such that the stream 256 does not have sufficient force to damage the carrier 104, the semiconductor device 102, and/or the dicing tape 124 in the event of accidental or intentional impingement of the stream 256 upon these components. Accordingly, because the fluid stream 256 can impact components other than the bonding adhesive 106 without damaging those components, the fluid delivery device 150 can have a large positional tolerance relative to the stack 108. This permits variation in the processing of and resulting thickness of the one or more layers that make up the bonding adhesive 106, as well as in the processing of the semiconductor device 102, while still allowing for successful debonding of the carrier 104. In contrast to the present technology, conventional systems including a blade require (i) precise and repeatable positioning of the blade and (ii) repeatable thickness processing for the dicing tape, semiconductor device, adhesive layer, and carrier because the blade can crack the semiconductor device and/or damage the carrier if misaligned during the debonding process.

Figure 3:
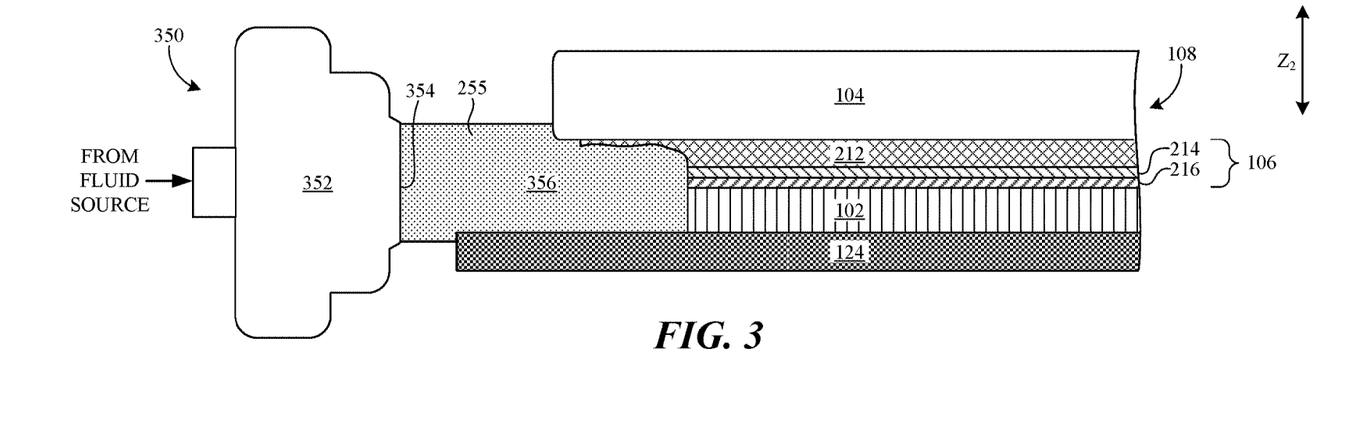
FIG. 3 is a partially schematic, side cross-sectional view of a portion of the system shown in FIG. 1, including a fluid delivery device configured in accordance with another embodiment of the present technology.

In some embodiments, the positional tolerance of the fluid delivery devices described herein can be further increased by increasing the size of the fluid stream directed from the fluid delivery device. For example, FIG. 3 is an enlarged, partially schematic, side cross-sectional view illustrating the portion of the stack 108 and dicing tape 124 in the region A illustrated in FIG. 1, and having a fluid delivery device 350 configured in accordance with another embodiment of the present technology. The fluid delivery device 350 includes a nozzle 352 and a corresponding nozzle exit 354 shaped and positioned to direct a stream 356 of fluid (e.g., the fluid 255) toward the interface between the carrier 104 and the semiconductor device 102.

In the embodiment illustrated in FIG. 3, the nozzle exit 354 is shaped and positioned such that stream 356 impacts each of the carrier 104, the support layer 212, the release layer 214, the protection layer 216, the semiconductor device 102, and the dicing tape 124. That is, the nozzle exit 354 and/or stream 356 can have a dimension (e.g., height, diameter, etc.) that is greater than a distance between the carrier 104 and the dicing tape 124. In a generally similar manner to the fluid delivery devices described above, the stream 356 impacts the bonding adhesive 106 to weaken or loosen the bonds between the layers 212-216, the carrier 104, and/or the semiconductor device 102 at and/or proximate to where the stream 356 contacts these components. In some embodiments, the relatively larger stream 356 of fluid 255 permits for greater tolerance in the positioning of the nozzle 352 of the fluid delivery device 350 relative to the stack 108. For example, in certain embodiments, initiating debonding of the carrier 104 from the semiconductor device 102 can be accomplished so long as the stream 356 contacts a portion of the bonding adhesive 106 (e.g., as opposed to the entire thickness of the bonding adhesive 106). Therefore, for example, the positioning of the nozzle exit 354 along an axis $Z_2$ can be varied while still permitting the stream 356 to contact a portion of the bonding adhesive 106 to initiate debonding.

Moreover, one feature of at least some of the systems and methods described above with reference to FIGS. 1-3 is that a fluid is delivered from a fluid delivery device to at least weaken or loosen an adhesive temporarily bonding a carrier to a semiconductor device. The debonding process does not contaminate the fluid delivery device because the fluid delivery device itself does not contact the adhesive to initiate debonding—rather, the fluid contacts the adhesive. In contrast, conventional systems that utilize a mechanical device such a blade to initiate debonding require periodic cleaning and replacement of the blade due to the blade's repeated contact with the bonding adhesive. For example, these conventional systems can build up significant adhesive residue from contact with adhesive at an edge exclusion region of the carrier (e.g., the portion 213 of the support layer 212 illustrated in FIG. 2A). The present technology can therefore lower the operating costs and improve the uptime efficiency for debonding systems, since the fluid delivery device does not require periodic replacement and cleaning because of contamination from repeated contact with an adhesive.

In general, it is expected that the foregoing processes can be conducted within the flow of existing temporary carrier debonding processes, either without modification or with relatively minor modifications. For example, it is not expected that any residual fluid remaining after the debonding operation will interfere with subsequent operations, particularly since the semiconductor device and/or carrier (e.g., in embodiments where the carrier is reused) must be subsequently cleaned to remove any residual adhesive after debonding.

Figure 4:
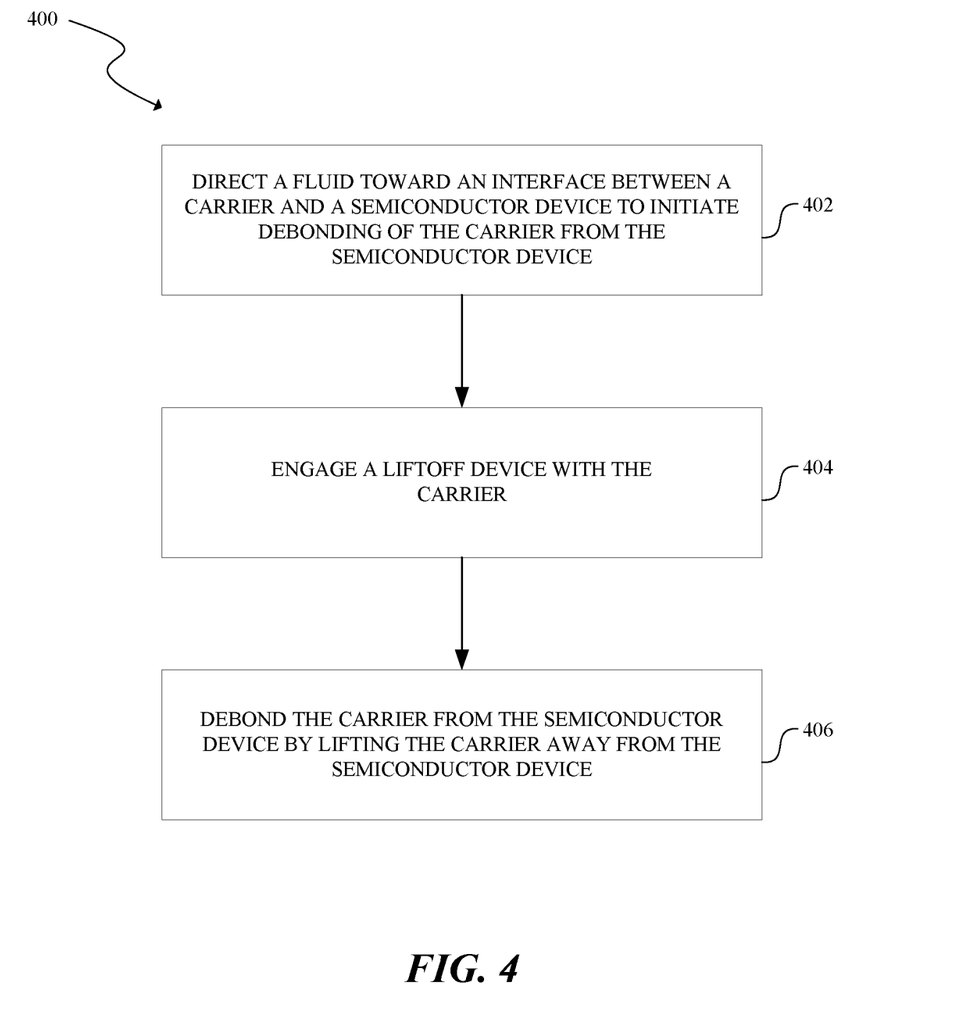
FIG. 4 is a flow diagram of a process or method for debonding a carrier from a semiconductor device in accordance with an embodiment of the present technology.

FIG. 4 is a flow diagram of a process or method 400 for debonding a temporary carrier from a semiconductor device in accordance with an embodiment of the present technology. The process 400 can be carried out, for example, using one or more of the systems described above with reference to FIGS. 1-3. Beginning at block 402, the process 400 comprises directing a fluid toward an interface between a carrier and a semiconductor device to initiate debonding of the carrier from the semiconductor device. For example, the fluid can be directed at an exposed portion of an adhesive layer between the carrier and the semiconductor device to weaken or loosen the adhesive layer and, correspondingly, a bonding force between the carrier and the semiconductor device. In certain embodiments, directing the fluid toward the interface includes directing the fluid toward the interface at a first location and at a second location different from the first location to loosen the adhesive proximate to the first location and the second location. At block 404, the process includes engaging a liftoff device with the carrier. At block 406, the process includes debonding the carrier from the semiconductor device by lifting the carrier away from the semiconductor device. In some embodiments, the fluid can be directed toward the interface between the carrier and the semiconductor device (block 402) at the same time or substantially the same time as the liftoff device engages the carrier (block 404) and/or lifts the carrier away from the semiconductor device (block 406).

From the foregoing, it will be appreciated that specific embodiments of the present technology have been described herein for purposes of illustration, but that various modifications may be made without deviating from the scope of the present technology. For example, in particular embodiments, the details of the fluid delivery device and/or other components of the systems for debonding a carrier from a semiconductor device may be different than those shown in the foregoing Figures. In particular embodiments, the fluids used to initiate debonding of the carrier from the semiconductor device may have compositions other than those expressly disclosed herein. The fluid can be delivered via one nozzle having a corresponding fluid exit, and in other embodiments, can be delivered via any suitable number of nozzles and/or fluid exits, for example, two nozzles, more than two nozzles, two fluid exits, or more than two fluid exits. The support substrate can be configured to support the semiconductor device via a dicing tape, as described in connection with several embodiments above, or via other releasable media or mechanisms.

Certain aspects of the technology described in the context of particular embodiments may be combined or eliminated in other embodiments. Further, while advantages associated with certain embodiments have been described in the context of those embodiments, other embodiments may also exhibit such advantages and not all embodiments need necessarily exhibit such advantages to fall within the scope of the present technology. Accordingly, the present disclosure and associated technology can encompass other embodiments not expressly shown or described herein.

I claim:

1. A system for debonding a temporary carrier from a semiconductor device, comprising:
   a support member positioned to carry the semiconductor device, the semiconductor device being bonded to a temporary carrier by an adhesive layer;
   a fluid delivery device having an exit positioned to direct a fluid toward the adhesive layer that temporarily bonds a first side of the temporary carrier to the semiconductor device, wherein the fluid delivery device and/or the support member is movable to vary a position of the exit of the fluid delivery device relative to the temporary carrier;
   a liftoff device configured to releasably attach to a second side of the temporary carrier and apply a debonding force to the temporary carrier; and
   a controller operably coupled to the fluid delivery device and the liftoff device, wherein the controller is configured to vary the debonding force based at least in part on the position of the exit of the fluid delivery device relative to the temporary carrier.

2. The system of claim 1 wherein the semiconductor device is a semiconductor wafer or a semiconductor panel.

3. The system of claim 1 wherein the directed fluid is configured to initiate debonding of the temporary carrier from the semiconductor device by loosening at least a portion of the adhesive layer.

4. The system of claim 1 wherein the adhesive layer includes at least a first layer and a second layer, and wherein the directed fluid is configured to loosen a bond between the first layer and the second layer.

5. The system of claim 4 wherein the first layer is a release layer and the second layer is a protection layer, and wherein the directed fluid is configured to at least partially separate the release layer from the protection layer.

6. The system of claim 1 wherein the fluid delivery device further includes a nozzle having the exit.

7. The system of claim 1 wherein the fluid is a solvent that is configured to at least partially dissolve the adhesive layer.

8. The system of claim 1 wherein the fluid is at least one of deionized water and an inert gas.

9. The system of claim 1 wherein the exit of the fluid delivery device is positioned to direct the fluid toward at least one of the semiconductor device and the temporary carrier.

10. The system of claim 1 wherein the exit of the fluid delivery device is positioned to direct the fluid toward only an exposed portion of the adhesive layer.

11. The system of claim 1 wherein a first height between the support member and the carrier is between about 90-120 µm, and wherein the exit is configured to direct the fluid toward the adhesive layer in a stream having a second height along an axis between the support member and the temporary carrier that is less than or equal to the first height.

12. A method for debonding a temporary carrier from a semiconductor device, comprising:
  directing a fluid toward an adhesive layer that temporarily bonds a first side of the carrier to the semiconductor device to initiate debonding of the carrier from the semiconductor device by loosening at least a portion of the adhesive layer,
    wherein the fluid is directed by a fluid delivery device having an exit positioned to direct the fluid toward only an exposed portion of the adhesive layer;
  moving the fluid delivery device and/or the carrier to change a position of the exit of the fluid delivery device relative to the carrier;
  engaging a second side of the carrier with a liftoff device; and
  applying a debonding force to the carrier with the liftoff device to lift the carrier away from the semiconductor device, wherein applying the debonding force includes varying the debonding force based at least in part on the position of the exit of the fluid delivery device relative to the carrier.

13. The method of claim 12 wherein directing the fluid toward the adhesive further includes:
  directing the fluid toward a first edge portion of the adhesive layer to loosen the adhesive layer proximate the first edge portion; and
  directing the fluid toward a second edge portion of the adhesive layer to loosen the adhesive layer proximate the second edge portion, wherein the first and second edge portions of the adhesive layer are located at circumferentially different positions relative to a center of the semiconductor device.

14. The method of claim 13 wherein the method further comprises:
  before directing the fluid toward the first edge portion, aligning an exit of the fluid delivery device with the first edge portion of the adhesive layer; and
  before directing the fluid toward the second edge portion, aligning the exit of the fluid delivery device with the second edge portion of the adhesive layer.

15. The method of claim 13 wherein moving the fluid delivery device and/or the carrier to change the position of the exit of the fluid delivery device relative to the carrier includes moving the fluid delivery device and the carrier circumferentially relative to one another.

16. The method of claim 12, further comprising:
  while lifting the carrier away from the semiconductor device, releasably securing the semiconductor device in a stationary or substantially stationary position.

17. A system for debonding a carrier from a semiconductor device, comprising:
  a support member releasably coupled to a lower surface of the semiconductor device, the semiconductor device being bonded to a temporary carrier;
  a fluid delivery device configured to direct a fluid stream toward an interface between an upper surface of the semiconductor device and a lower surface of the temporary carrier to weaken a bond between the semiconductor device and the temporary carrier, wherein the fluid delivery device and/or the support member is movable to vary a position of the exit of the fluid delivery device relative to the temporary carrier;
  a liftoff device having at least one vacuum head configured to releasably attach to an upper surface of the carrier, wherein the liftoff device is configured to apply a debonding force to the temporary carrier to lift the temporary carrier away from the semiconductor device after and/or while the fluid delivery device weakens the bond between the semiconductor device and the temporary carrier; and
  a controller operably coupled to the fluid delivery device and the liftoff device, wherein the controller is configured to vary the debonding force based at least in part on the position of the exit of the fluid delivery device relative to the temporary carrier.

18. The system of claim 17 wherein the fluid delivery device is configured to direct the fluid toward only the exposed portion of the adhesive layer at a pressure of between 1 to 75 PSI.

19. The system of claim 17 wherein the fluid delivery device is configured to direct the fluid toward only the exposed portion of the adhesive layer at a pressure not greater than 75 PSI.

* * * * *